(12) United States Patent
Kanagawa et al.

(10) Patent No.: US 7,336,446 B2
(45) Date of Patent: Feb. 26, 2008

(54) SUSPENSION BOARD HAVING A CIRCUIT AND A FLYING LEAD PORTION

(75) Inventors: Hitoki Kanagawa, Osaka (JP); Yasuhito Funada, Osaka (JP); Tetsuya Oosawa, Osaka (JP)

(73) Assignee: Nitto Denko Corporation (JP)

( * ) Notice: Subject to any disclaimer, the term of this patent is extended or adjusted under 35 U.S.C. 154(b) by 237 days.

(21) Appl. No.: 11/002,199

(22) Filed: Dec. 3, 2004

(65) Prior Publication Data

US 2005/0122627 A1    Jun. 9, 2005

(30) Foreign Application Priority Data

Dec. 4, 2003  (JP)  ............... 2003-405739

(51) Int. Cl.
*G11B 21/16* (2006.01)

(52) U.S. Cl. .................................... 360/245.9
(58) Field of Classification Search ............... None
See application file for complete search history.

(56) References Cited

U.S. PATENT DOCUMENTS

| | | | | |
|---|---|---|---|---|
| 5,844,753 A | * | 12/1998 | Inaba | ............... 360/264.2 |
| 5,857,257 A | * | 1/1999 | Inaba | ............... 29/603.04 |
| 6,399,899 B1 | | 6/2002 | Ohkawa et al. | |
| 2003/0026078 A1 | | 2/2003 | Komatsubara et al. | |

FOREIGN PATENT DOCUMENTS

| | | |
|---|---|---|
| JP | 8-139136 | 5/1996 |
| JP | 11-214453 | 8/1999 |
| JP | 2001-209918 | 8/2001 |
| JP | 2003-31915 | 1/2003 |

* cited by examiner

*Primary Examiner*—David Davis
(74) *Attorney, Agent, or Firm*—Akerman Senterfitt; Jean C. Edwards, Esq.

(57) ABSTRACT

A suspension board with circuit having a conductor layer formed in the form of a fine wiring circuit by an additive process, while providing a reduced risk of damage and breaking of the conductor layer in a flying lead portion. The suspension board with circuit comprises a supporting board 2, an insulating base layer 3 formed on the supporting board 2, a conductor layer 4 formed on the insulating base layer 3, an insulating cover layer 5 formed on the conductor layer 4, and a flying lead portion 9 in which a supporting-board-side opening 13, a base-layer-side opening 14, and a cover-layer-side opening 15 are formed so that both sides of the conductor layer 4 can be exposed therefrom. A reinforcing portion 16 or 23 for reinforcing the conductor layer 4 formed continuously from at least either of the insulating base layer 3 and the insulating cover layer 5 along the longitudinal direction of the conductor layer 4 is included in the flying lead portion 9.

4 Claims, 12 Drawing Sheets

(a)

(b)

(c)

(d)

(e)

(a)

(b)

(c)

(d)

(e)

SUSPENSION BOARD HAVING A CIRCUIT AND A FLYING LEAD PORTION

BACKGROUND OF THE INVENTION

1. Field of the Invention

The present invention relates to a suspension board with circuit, and more particularly, to a suspension board with circuit used for a hard disc drive.

2. Description of the Prior Art

A suspension board with circuit used for a hard disc drive is a wired circuit board comprising a suspension board supporting a magnetic head and a wiring circuit pattern, integrally formed on the suspension board, for connecting between the magnetic head and a read/write board to which read/write signals read and written by the magnetic head are transmitted. The suspension board with circuit is now being in widespread use in that it can support the magnetic head, with a minute interval between the magnetic head and a magnetic disk held against an airflow generated when the magnetic head and the magnetic disk run relative to each other, so that it can well maintain the floatation of the magnetic head mounted on the suspension board.

This suspension board with circuit usually comprises, as shown in FIG. 14(a), a supporting board 101 of a stainless foil or the like metal foil, an insulating base layer 102 formed on the supporting board 101, a conductor layer 103 formed in a wiring circuit pattern on the insulating base layer 102, and an insulating cover layer 104 to cover the conductor layer 103. It further comprises an external connection terminal 105 to connect the wiring arranged in the form of a wiring circuit pattern with the read/write board (not shown).

This external connection terminal 105 formed in the suspension board with circuit includes a flying lead portion. The flying lead portion is formed in such a manner that the supporting board 101 and the insulating base layer 102 are opened at the back side of the conductor layer 103 and also the insulating cover layer 104 is opened at the front side of the conductor layer 103, so that front and back sides of the conductor layer 103 are exposed, as shown in FIG. 14(b). In the flying lead portion, a pad portion 108 comprising a nickel plating layer 106 and a gold plating layer 107 is formed on both of the front and back sides of the conductor layer 103 (Cf JP Laid-open (Unexamined) Patent Publication No. 2001-209918, for example).

In this suspension board with circuit, the forming of a fine wiring circuit pattern is usually required for patterning the conductor layer 103 into a wiring circuit pattern. The additive process is used for the patterning, accordingly. In the additive process, after a seed film 109 of conductive material is formed on the insulating base layer 102, a plating resist (not shown) having a reverse pattern to the wiring circuit pattern is formed on the seed film 109 and then the conductor layer 103 is formed in the form of a wiring circuit pattern on the seed film 109 exposed from the plating resist, as shown in FIG. 14(a). Thereafter, the entire surface of the seed film 109 is removed, except a portion thereof where the plating resist and the conductor layer 103 are formed (Cf. JP Laid-open (Unexamined) Patent Publication No. 2001-209918, for example).

In the suspension board with circuit including the flying lead portion, when the conductor layer is formed in the wiring circuit pattern by the additive process, there is a possibility that the conductor layer and pad portion exposed in the flying lead portion may be damaged in the additive process. This is because since the additive process involves various production processes including the treatment process using a treatment agent and the washing process using washing water, there is a possibility that the conductor layer and pad portion exposed in the flying lead portion may be physically damaged directly, so that the conductor layer and the pad portion may be broken in the processes of the additive process. Particularly in the case of the conductor layer exposed in the flying lead portion being required to be thin, the possibility of such a breaking will increase.

SUMMARY OF THE INVENTION

It is the object of the invention to provide a suspension board with circuit having a conductor layer formed in the form of a fine wiring circuit pattern by an additive process, while providing a reduced risk of damage and breaking of the conductor layer in a flying lead portion.

The present invention provides a suspension board with circuit comprising a metal supporting layer, an insulating base layer formed on the metal supporting layer, a conductor layer formed on the insulating base layer, an insulating cover layer formed on the conductor layer, and a flying lead portion in which the metal supporting layer, the insulating base layer and the insulating cover layer are opened so that both sides of the conductor layer can be exposed, wherein at least one of the insulating base layer and the insulating cover layer is included as a reinforcing portion for reinforcing the conductor layer in the flying lead portion.

In this suspension board with circuit, the insulating layer is included as the reinforcing portion for reinforcing the conductor layer in the flying lead portion. This can provide the result that even when the conductor layer in the flying lead portion is physically damaged directly when the conductor layer is formed in the form of a fine wiring circuit pattern via various production processes of the additive process, fatal damage or breaking of the conductor layer can be prevented by the reinforcement provided by the reinforcing portion. This can produce the suspension board with circuit wherein while the conductor layer is formed in the form of a fine wiring circuit pattern, the fatal damage or breaking of the conductor layer in the flying lead portion can be effectively prevented, thus providing improvement in reliability of the suspension board with circuit for use.

In the suspension board with circuit of the present invention, the reinforcing portion is arranged along a longitudinal direction of the conductor layer in the flying lead portion.

The arrangement of the reinforcing portion being arranged along the longitudinal direction of the conductor layer can permit reliable reinforcement of the conductor layer over the longitudinal dimension of the conductor layer in the flying lead portion. It can also provide the result that the reinforcing portion can be formed continuously from the insulating layer.

Accordingly, it is preferable for this case that the reinforcing portion is formed continuously from the insulating base layer in the flying lead portion or is formed continuously from the insulating cover layer in the flying lead portion.

(a) shows the process of preparing a supporting board;

(b) shows the process of coating a solution of precursor of photosensitive polyimide resin on the entire surface of the supporting board and then forming a coating of the precursor of the photosensitive polyimide resin by heating;

(c) shows the process of exposing the coating to light through a photo mask and developing it, to form the coating into a predetermined pattern;

(d) shows the process of curing the coating and forming an insulting base layer of polyimide resin with a predetermined pattern defining a plurality of protruding reinforcing portions in an area of the insulating base layer where an external connection terminal portion is to be formed; and (e) shows the process of forming a seed film of a thin film made of conductive material on the entire surface of the supporting board and insulating base layer.

Figure 2:
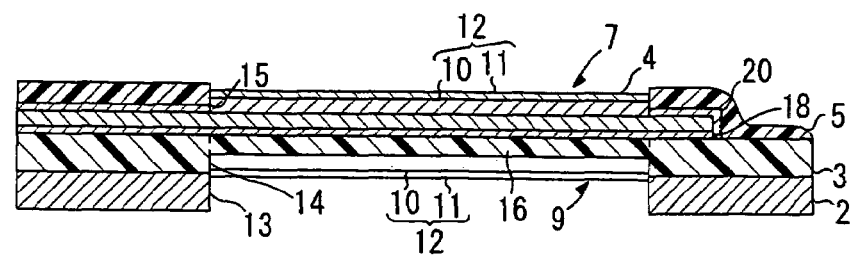
FIG. 2 is a sectional view of an external connection terminal of the suspension board with circuit shown in FIG. 1 taken along a longitudinal direction of the suspension board with circuit.
Figure 4:
FIG. 4 is a process drawing showing a production method of the suspension board with circuit shown in FIG. 2.
Figure 4:
Figure 4:
Figure 4:
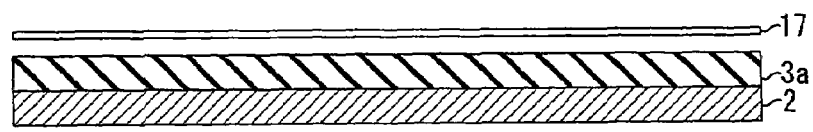
Figure 4:
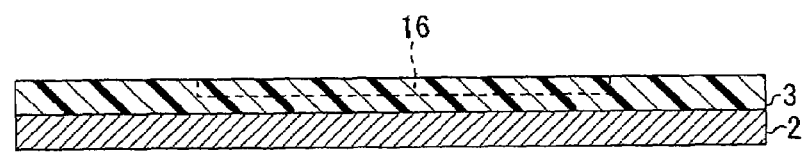
Figure 5:
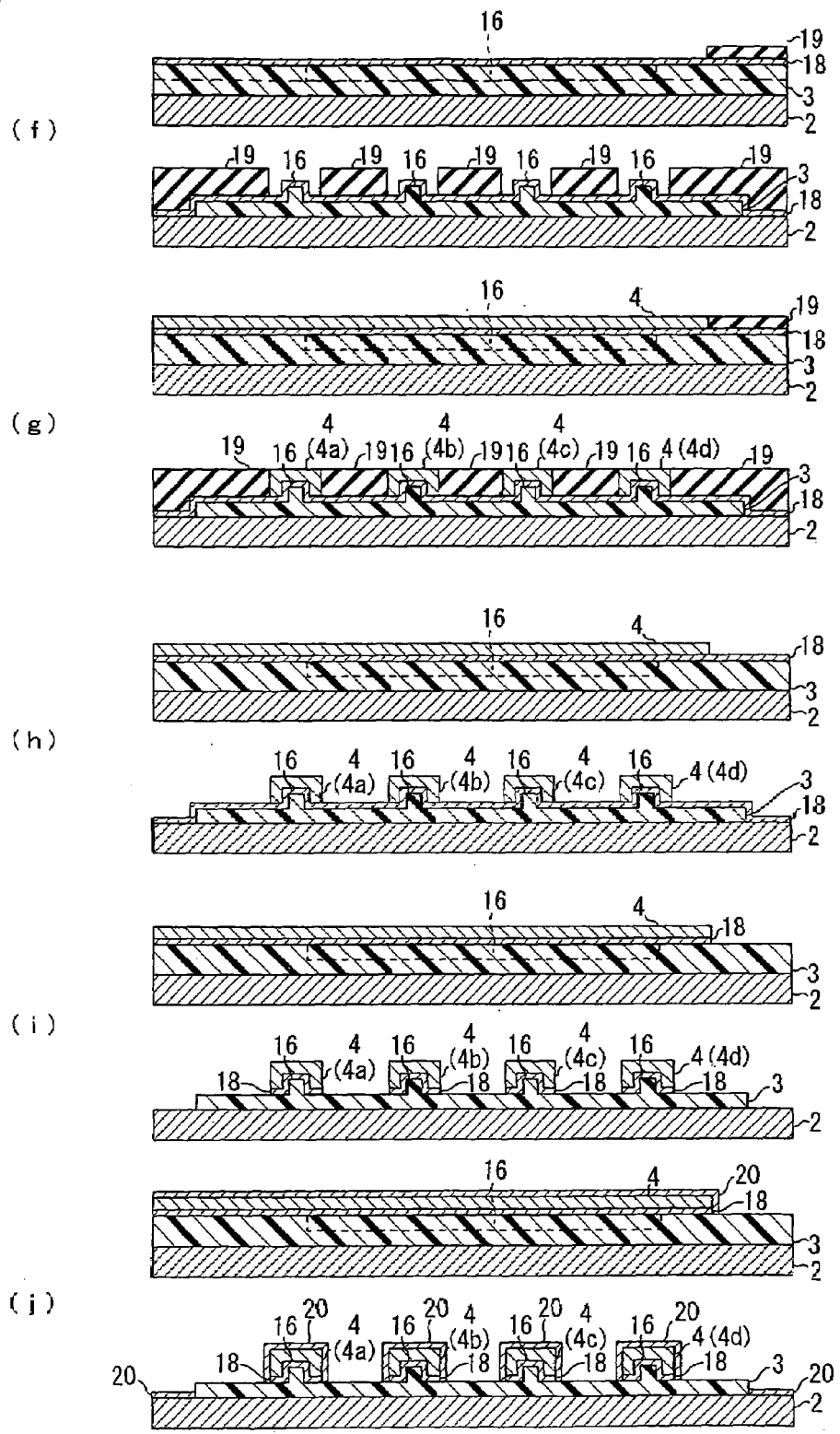

FIG. 5 is a process drawing, which is the sequence of FIG. 4, showing the production method of the suspension board with circuit shown in FIG. 2:

(f) shows the process of forming on the seed film a plating resist having a reverse pattern to a wiring circuit pattern;

(g) shows the process of forming a conductor layer of the wiring circuit pattern by plating on an area of the insulating base layer where the plating resist is not formed;

(h) shows the process of removing the plating resist;

(i) shows the process of removing the part of the seed film where the plating resist was formed; and (j) shows the process of forming a metal coating on the surface of the conductor layer and the surface of the supporting board.

Figure 6:
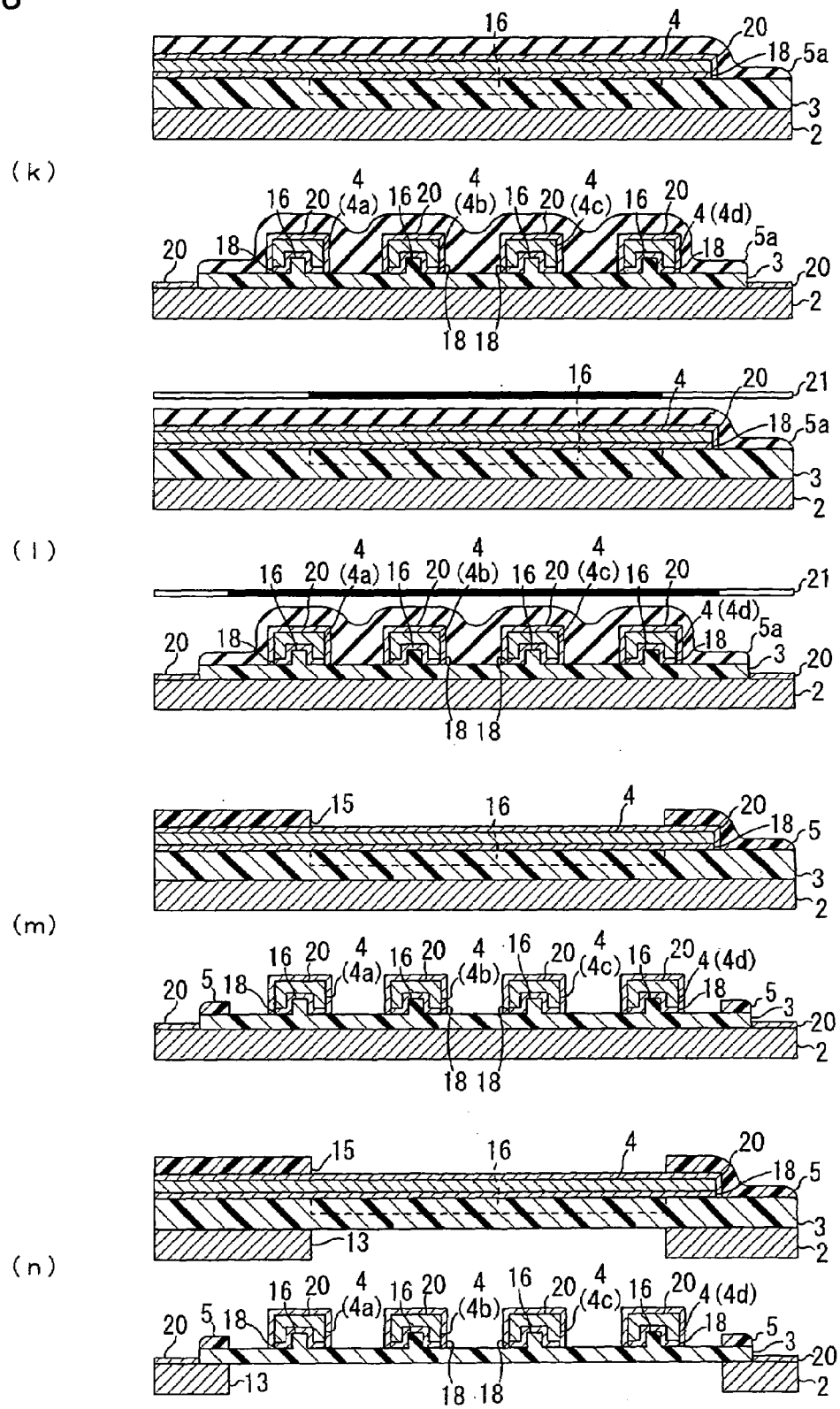

FIG. 6 is a process drawing, which is the sequence of FIG. 5, showing the production method of the suspension board with circuit shown in FIG. 2:

(k) shows the process of coating a solution of precursor of photosensitive polyimide resin on the entire surface of the insulating base layer and the metal coating and then forming a coating of the precursor of the photosensitive polyimide resin by heating;

(l) shows the process of exposing the coating to light through a photo mask and developing it, so that the coating is patterned to cover the conductor layer with the coating;

(m) shows the process of curing the coating and forming an insulting cover layer of polyimide resin on the conductor layer; and (n) shows the process of cutting off the supporting board to a predetermined shape such as a gimbals shape and also cutting off the supporting board at the portion thereof where the external connection terminal is to be formed, to form a supporting-board-side opening.

Figure 7:
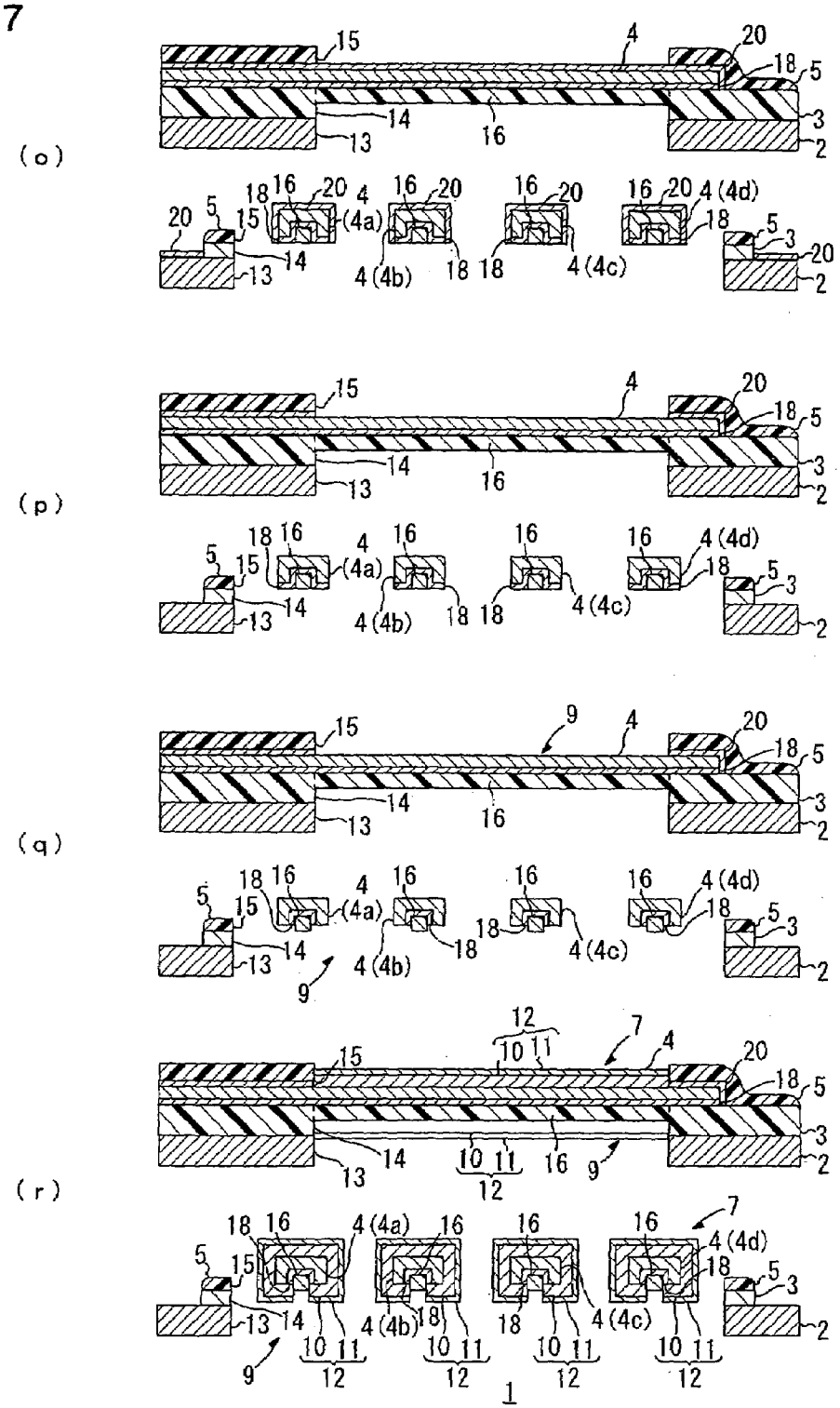

FIG. 7 is a process drawing, which is the sequence of FIG. 6, showing the production method of the suspension board with circuit shown in FIG. 2:

(o) shows the process of removing the insulating base layer exposed from the supporting-board-side opening in such a manner that the protruding reinforcing portions remain;

(p) shows the process of removing the metal coating exposed from a base-layer-side opening and a cover-layer-side opening;

(q) shows the process of removing the seed film on the conductor layer exposed from the base-layer-side opening and the cover-layer-side opening; and (r) shows the process of forming a nickel plating layer and a gold plating layer in sequence on the conductor layer exposed in a flying lead portion.

Figure 1:
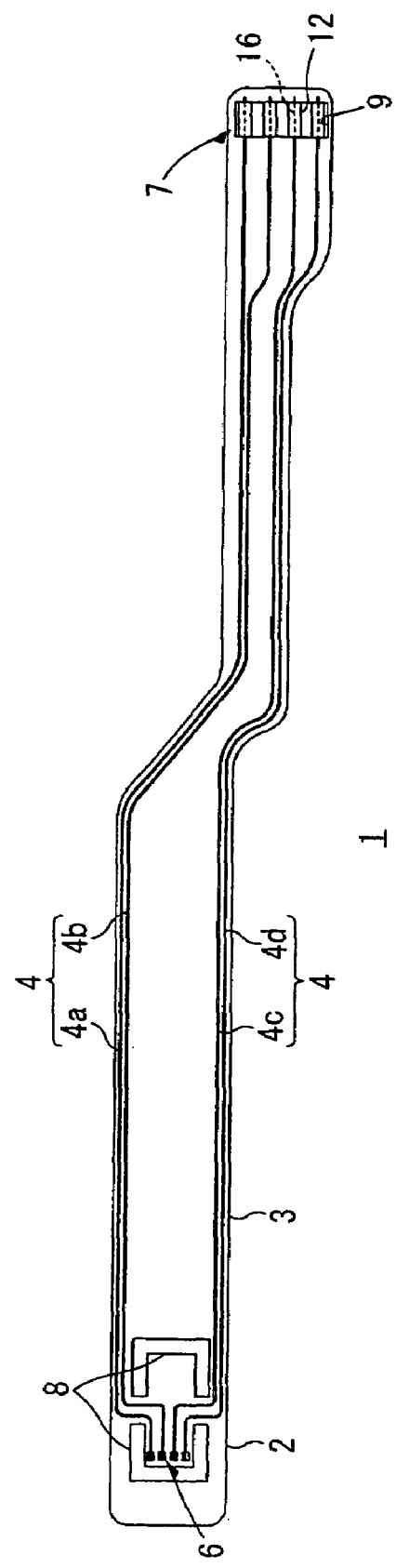
FIG. 1 is a plane view showing an embodiment of a suspension board with circuit of the present invention.
Figure 8:
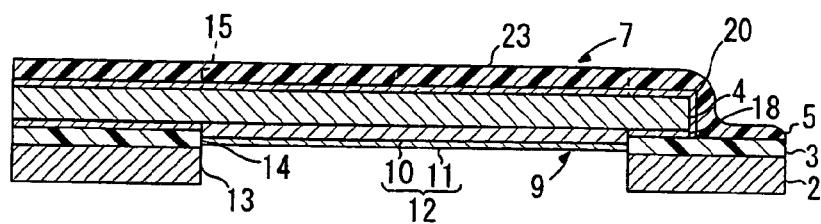

FIG. 8 is a sectional view of an external connection terminal of another embodiment of the suspension board with circuit shown in FIG. 1 taken along a longitudinal direction of the suspension board with circuit.

Figure 9:
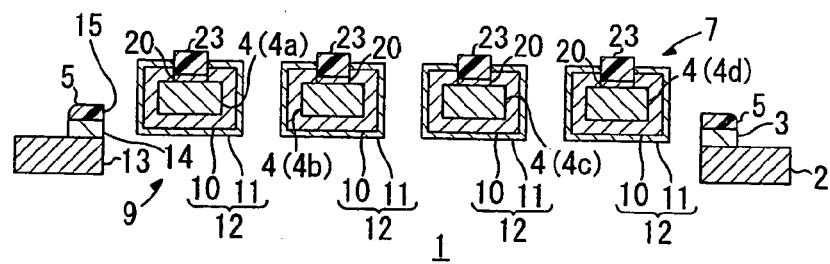

FIG. 9 is a sectional view of the external connection terminal of the suspension board with circuit shown in FIG. 8 taken along a direction orthogonal to the longitudinal direction of the suspension board with circuit.

Figure 10:
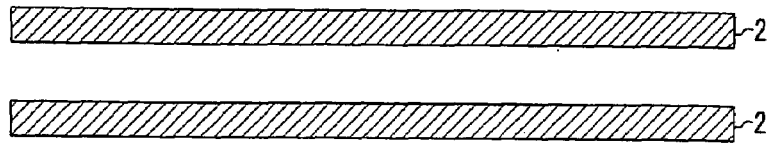
Figure 10:
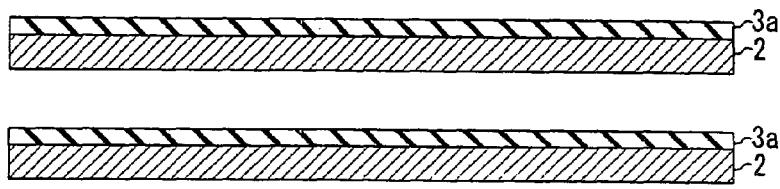
Figure 10:
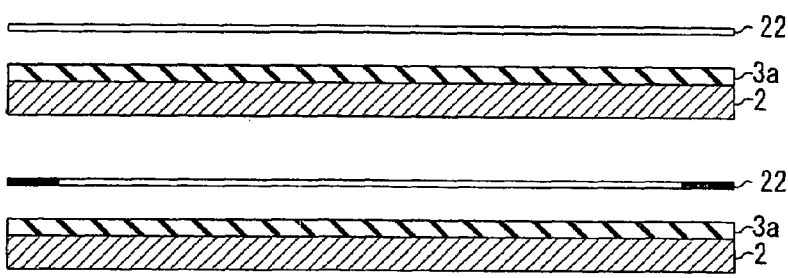
Figure 10:
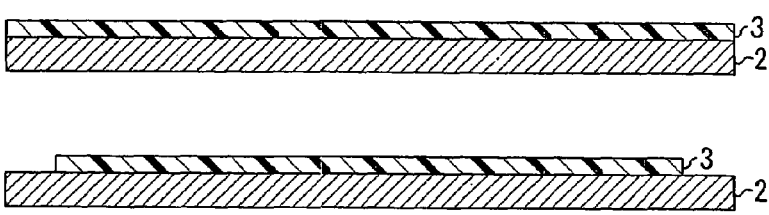
Figure 10:
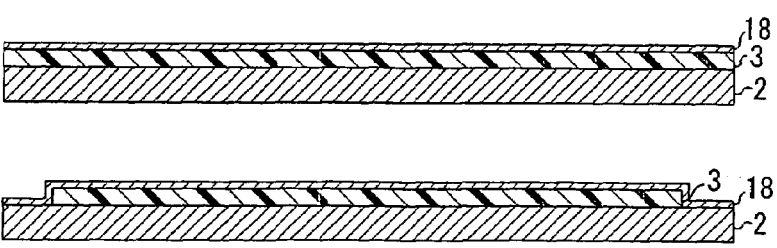

FIG. 10 is a process drawing showing a production method of the suspension board with circuit shown in FIG. 8:

(a) shows the process of preparing a supporting board;

(b) shows the process of coating a solution of precursor of photosensitive polyimide resin on the entire surface of the supporting board and then forming a coating of the precursor of the photosensitive polyimide resin by heating;

(c) shows the process of exposing the coating to light through a photo mask and developing it, to form the coating into a predetermined pattern;

(d) shows the process of curing the coating and forming an insulting base layer of polyimide resin with a predetermined pattern; and (e) shows the process of forming a seed film of a thin film made of conductive material on the entire surface of the supporting board and the insulating base layer.

Figure 11:
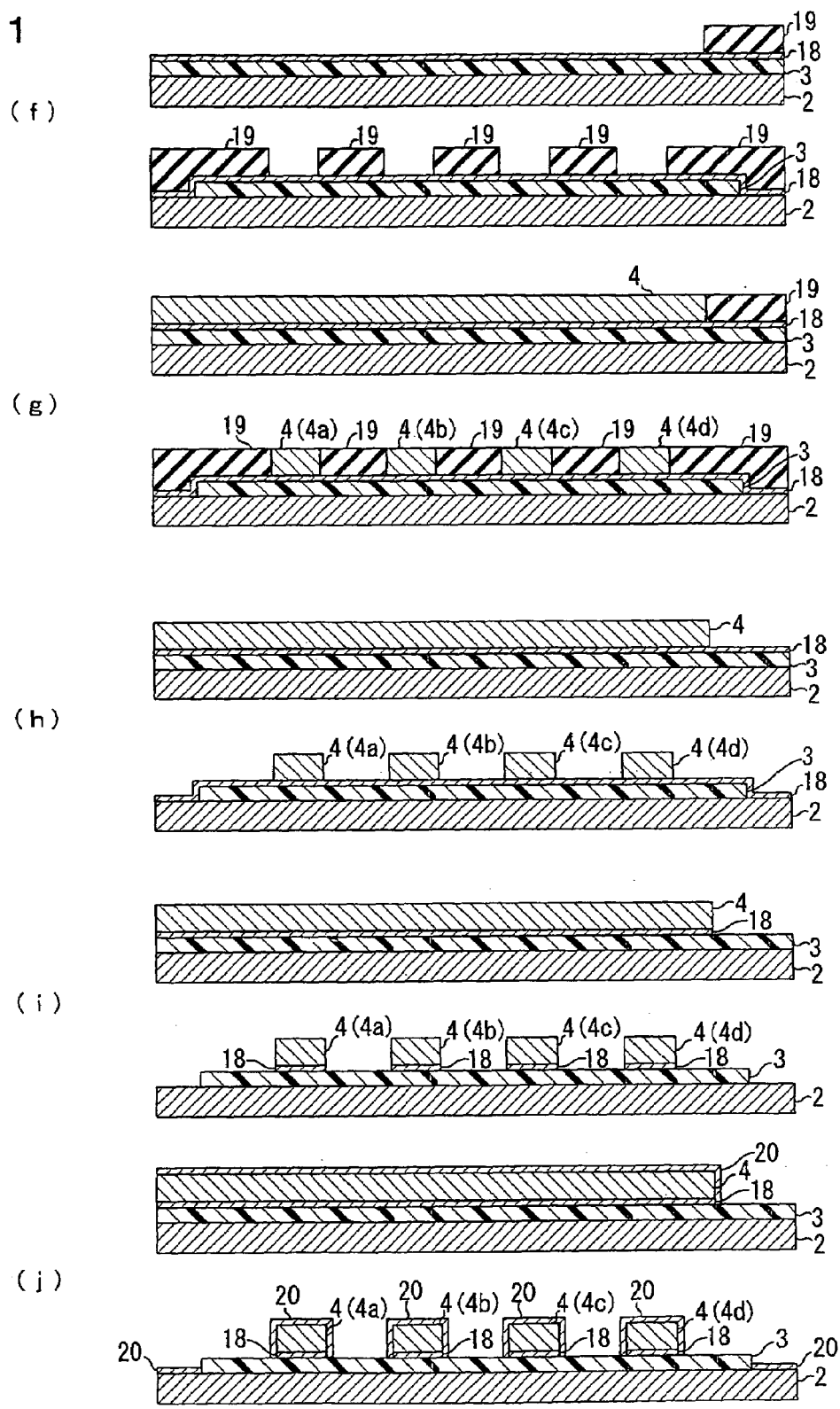

FIG. 11 is a process drawing, which is the sequence of FIG. 10, showing the production method of the suspension board with circuit shown in FIG. 8:

(f) shows the process of forming on the seed film a plating resist having a reverse pattern to a wiring circuit pattern;

(g) shows the process of forming a conductor layer of the wiring circuit pattern by plating on an area of the insulating base layer where the plating resist is not formed;

(h) shows the process of removing the plating resist;

(i) shows the process of removing the part of the seed film where the plating resist was formed; and (j) shows the process of forming a metal coating on the surface of the conductor layer and the surface of the supporting board.

Figure 12:
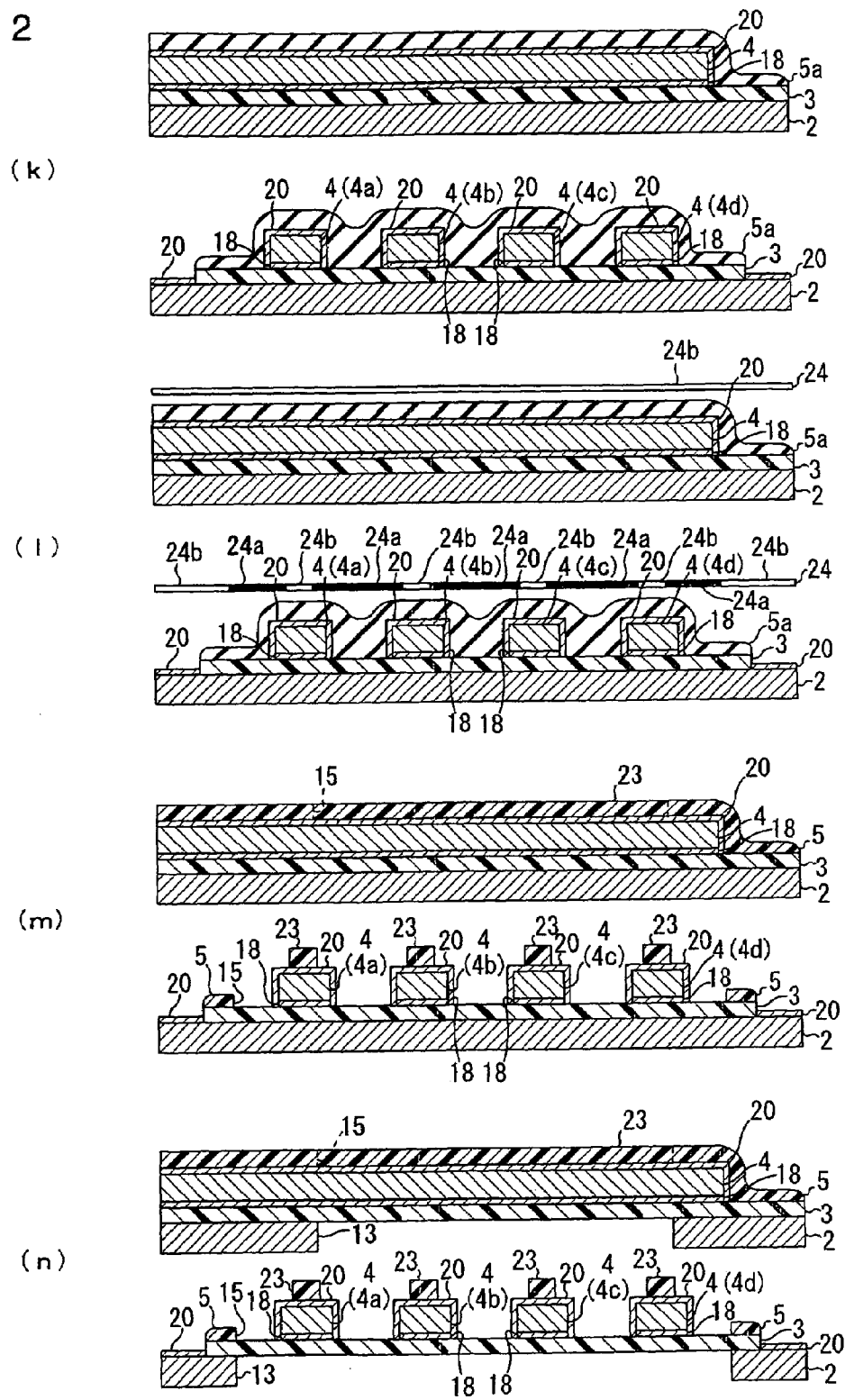

FIG. 12 is a process drawing, which is the sequence of FIG. 11, showing the production method of the suspension board with circuit shown in FIG. 8:

(k) shows the process of coating a solution of precursor of photosensitive polyimide resin on the entire surface of the insulating base layer and metal coating and then forming a coating of the precursor of the photosensitive polyimide resin by heating;

(l) shows the process of exposing the coating to light through a photo mask and developing it, so that the coating is patterned to cover the conductor layer with the coating;

(m) shows the process of curing the coating and forming an insulting cover layer of polyimide resin on the conductor layer in such a manner that reinforcing portions are formed in sequence from the insulating cover layer; and (n) shows the process of cutting off the supporting board to a predetermined shape such as a gimbals shape and also cutting off the supporting board at the portion thereof where the external connection terminal is to be formed, to form a supporting board-side opening.

Figure 13:
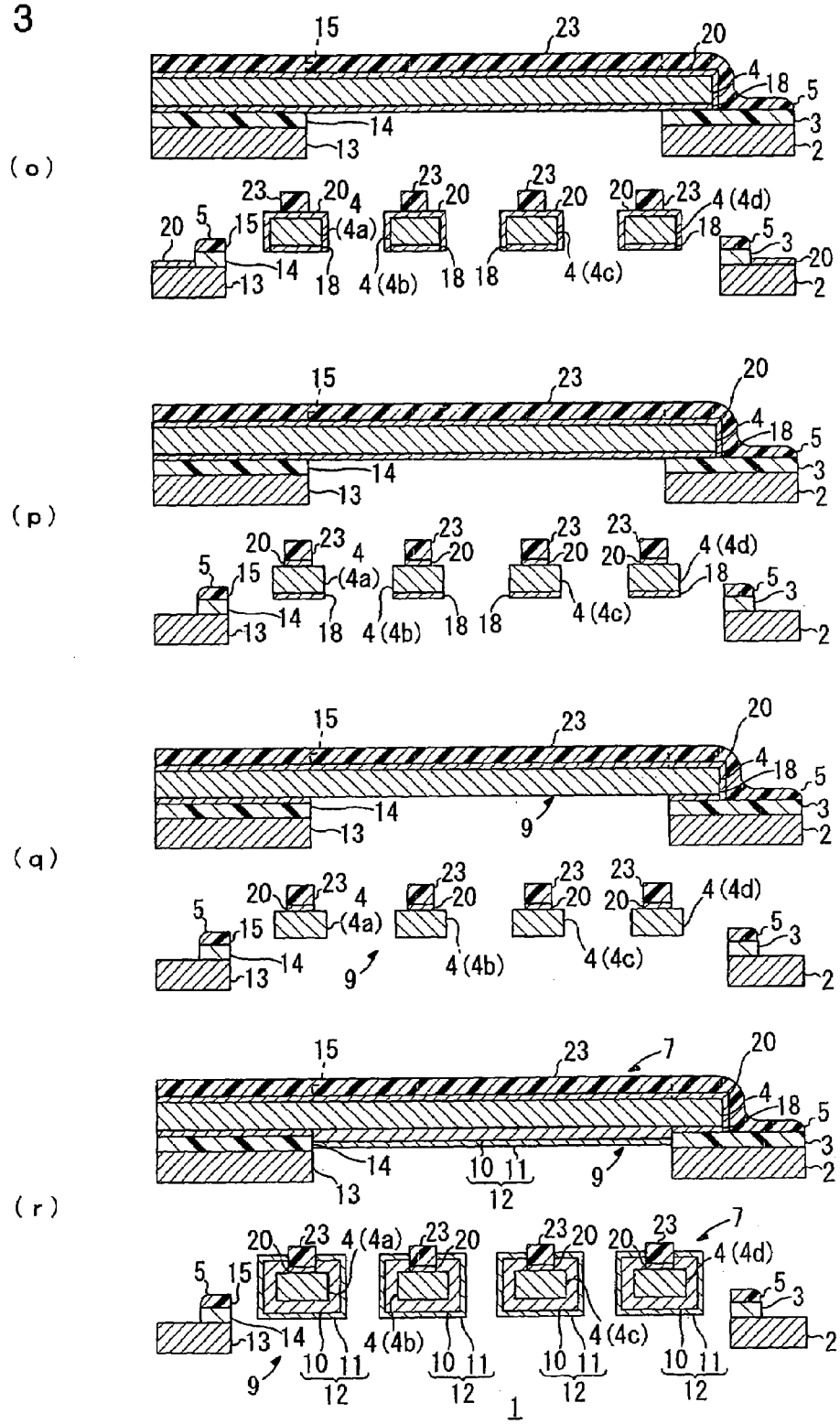

FIG. 13 is a process drawing, which is the sequence of FIG. 12, showing the production method of the suspension board with circuit shown in FIG. 8:

(o) shows the process of removing the insulating base layer exposed from the supporting-board-side opening;

(p) shows the process of removing the metal coating exposed from a base-layer-side opening and a cover-layer-side opening;

(q) shows the process of removing the seed film on the conductor layer exposed from the base-layer-side opening and the cover-layer-side opening; and (r) shows the process of forming a nickel plating layer and a gold plating layer in sequence on the conductor layer exposed in a flying lead portion.

Figure 14:
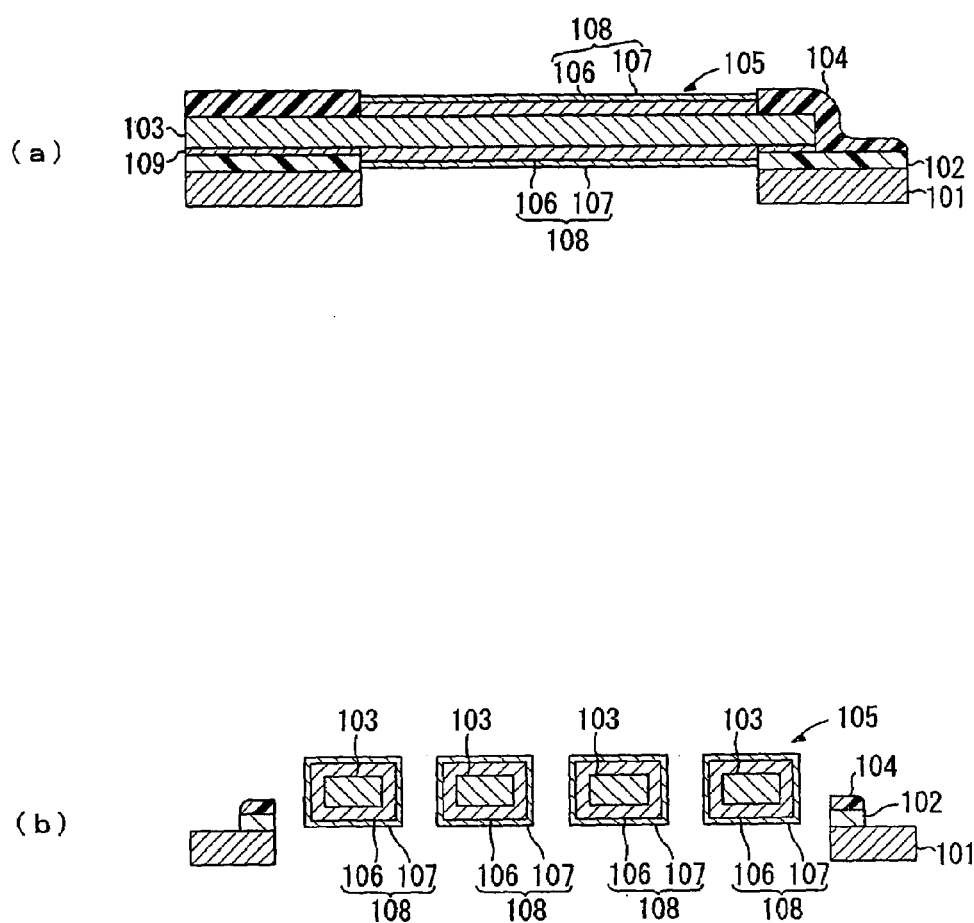

FIG. 14 is a sectional view showing a principal part of a flying lead portion of a conventional suspension board with circuit.

DETAILED DESCRIPTION OF THE PREFERRED EMBODIMENTS

FIG. 1 is a plane view showing an embodiment of a suspension board with circuit of the present invention; FIG. 2 is a sectional view of an external connection terminal of the suspension board with circuit shown in FIG. 1 taken along a longitudinal direction of the suspension board with circuit; and FIG. 3 is a sectional view of the external connection terminal of the suspension board with circuit shown in FIG. 2 taken along a direction orthogonal to the longitudinal direction of the suspension board with circuit.

This suspension board with circuit mounts thereon a magnetic head of a hard disk drive (not shown) and supports the magnetic head, with a minute interval between the magnetic head and a magnetic disk against an airflow generated when the magnetic head and the magnetic disk run relative to each other. The suspension board with circuit has the wiring circuit pattern integrally formed for connecting between the magnetic head and a read/write board of an external circuit.

Figure 3:
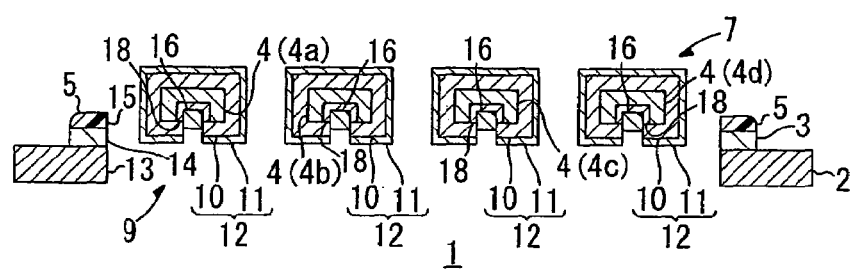
FIG. 3 is a sectional view of the external connection terminal of the suspension board with circuit shown in FIG. 2 taken along a direction orthogonal to the longitudinal direction of the suspension board with circuit.

In FIG. 1, the suspension board with circuit 1 comprises a supporting board 2 in the form of a metal supporting layer extending longitudinally, an insulating base layer 3 formed on the supporting board 2, a conductor layer 4 in the form of a wiring circuit pattern formed on the insulating base layer 3, and an insulating cover layer 5 formed on the conductor layer 4 (not shown in FIG. 1, See FIGS. 2 and 3).

The wiring circuit pattern of the conductor layer 4 is in the form of a plurality of lines of wire 4a, 4b, 4c, and 4d arrayed in parallel with each other and spaced apart at a predetermined interval. The supporting board 2 is provided, at a front end portion thereof, with gimbals 8 for fitting the magnetic heads therein which are formed by cutting out the supporting board 2. It is also provided, at the front end portion thereof, with a magnetic head connection terminal 6 for connecting between the magnetic head and the lines of wire 4a, 4b, 4c, and 4d. Also, the supporting board 2 is provided, at a rear end portion thereof, with an external connection terminal 7 for connecting between a terminal of a read/write board (not shown) and the lines of wire 4a, 4b, 4c, and 4d.

In this suspension board with circuit 1, the external connection terminal 7 includes a flying lead portion 9 exposed from both sides of the conductor layer 4, as shown in FIGS. 2 and 3. The flying lead portion 9 is formed in such a manner that the supporting board 2 and the insulating base layer 3 are opened at the back side of the conductor layer 4 and also the insulating cover layer 5 is opened at the front side of the conductor layer 4 to correspond in position to the opening at the back side of the conductor layer 4, whereby the front side of the conductor layer 4 is exposed from the insulating cover layer 5 and the back side of the same is exposed from the supporting board 2 and insulating base layer 3. In this flying lead portion 9, a pad portion 12 is formed which comprises a nickel plating layer 10 and a gold plating layer 11 which are formed in sequence on the front side of the conductor layer 4, both lateral sides thereof, and the back side thereof (except exposed portions of a reinforcing layer 16 mentioned later). The pad portion 12 may be formed by the gold plating layer 11 only, though not shown.

To be more specific, the external connection terminal 7 has a supporting board-side opening 13 of a generally rectangular form formed in the supporting board 2 and a base-layer-side opening 14 formed in the insulating base layer 3 to correspond in position to the supporting-board-side opening 13, both openings 13, 14 being formed at the back side of the conductor layer 4 to include an area thereof near rear end portions of the lines of wire 4a, 4b, 4c, and 4d. It also has a cover-layer-side opening 15, formed at the front side of the conductor layer 4, to make the insulating cover layer 5 open to correspond in position to the supporting-board-side opening 13 and base-layer-side opening 14.

In the flying lead portion 9, the back side of the conductor layer 4 is exposed from the supporting-board-side opening 13 and base-layer-side opening 14 and the front side of the conductor layer 4 is exposed from the cover-layer-side opening 15. Also, the pad portion 12 comprising the nickel plating layer 10 and the gold plating layer 11 or the pad portion 12 comprising the gold plating layer 11 only (not shown) is formed on the conductor layer 4 thus exposed.

In the flying lead portion 9, the insulating base layer 3 is included as a reinforcing portion 16 for reinforcing the conductor layer 4. The reinforcing portion 16 is buried in each line of wire 4a, 4b, 4c, 4d along a longitudinal direction of the conductor layer 4 exposed in the flying lead portion 9, in the state of being partly exposed from a bottom of the each line of wire 4a, 4b, 4c, 4d. Also, it is formed to be continuous from the insulating base layer 3 at both lengthwise ends of the flying lead portion 9 so that it passes through the flying lead portion 9 with respect to the longitudinal direction. This arrangement of the reinforcing portion 16 being arranged along the longitudinal direction of the conductor layer 4 can permit reliable reinforcement of the conductor layer 4 over the longitudinal dimension of the conductor layer 4 in the flying lead portion 9. In addition, the arrangement of the reinforcing portion 16 being arranged along the longitudinal direction of the conductor layer 4 can provide the advantage that the reinforcing portion 16 can be formed continuously from the insulating base layer 3.

Next, the method of producing this suspension board with circuit 1 will be described with reference to FIGS. 4-7. It should be noted that in FIGS. 4-7, part of the suspension board with circuit 1, including the area where the external connection terminal 7 is formed, is shown in section taken along a longitudinal direction of the suspension board with circuit 1 and is shown at the top of each process, and part of the suspension board with circuit 1, including the area where the external connection terminal 7 is formed, is shown in section taken along a direction orthogonal to the longitudinal direction of the suspension board with circuit 1 (or along a widthwise direction (hereinafter this definition is used)) and is shown at the bottom of each process.

In this method, as shown in FIG. 4(a), the supporting board 2 is prepared, first.

A metal foil or a thin metal sheet is preferably used as the supporting board 2. For example, stainless steel, 42-alloy and the like are preferably used for the supporting board 2. The supporting board 2 preferably has a thickness of 10-60 μm, or preferably 15-30 μm, and a width of 50-500 mm, or preferably 125-300 mm.

Then, the insulating base layer 3 is formed with a predetermined pattern defining the protruding reinforcing portion 16 in an area thereof where the external connection terminal 7 is to be formed, as shown in FIG. 4(*b*) to FIG. 4(*d*). The reinforcing portion 16 comprises a plurality of protruding portions, spaced apart from each other at a predetermined distance in the widthwise direction and extended over the whole length of the flying lead 9 mentioned later along the longitudinal direction of the conductor layer 4, to correspond to the lines of wire 4*a*, 4*b*, 4*c*, and 4*d*.

The insulating materials that may be used for forming the insulating base layer 3 include, for example, synthetic resins, such as polyimide resin, acrylic resin, polyether nitrile resin, polyether sulfonic resin, polyethylene terephthalate resin, polyethylene naphthalate resin and polyvinyl chloride resin. Of these synthetic resins, a photosensitive synthetic resin is preferably used for forming the insulating base layer 3 with the predetermined pattern. The photosensitive polyimide resin is further preferably used.

For example when photosensitive polyimide resin is used to form the insulating base layer 3 with the predetermined pattern on the supporting board 2, a solution of precursor of the photosensitive polyimide resin (polyamic acid resin) is coated over the entire surface of the supporting board 2, as shown in FIG. 4(*b*). Then, the coated polyimide resin is heated at e.g. 60-150° C., or preferably at 80-120° C., to form a coating 3*a* of the precursor of the photosensitive polyimide resin.

Then, the coating 3*a* is exposed to light through a photo mask 17, as shown in FIG. 4(*c*), and, if required, it is heated to a certain temperature. Thereafter, the coating 3*a* is developed to be formed into a predetermined pattern. For example, when the coating 3*a* is formed with a negative type pattern, a gradation exposure mask, which comprises a light shielding part 17*a* (whose light transmission is 0%) corresponding to a portion of the coating 3*a* where the insulating base layer 3 is not to be formed, a semi-transparent part 17*b* (whose light transmission is 20-80%) corresponding to a portion of the coating 3*a* on a side thereof opposite a portion of the coating 3*a* where a supporting-board-side opening 13 mentioned later from which the insulating base layer 3 is exposed is to be formed (or corresponding to a portion of the coating 3*a* on a side thereof that does not confront the reinforcing portion 16), and a light transmission part 17*c* (whose light transmission is 100%) corresponding to a portion of the coating 3*a* where the reinforcing portion 16 and the insulating base layer 3 on the supporting board 2 are to be formed, is used as the photo mask 17.

When this gradation exposure mask is used, a specific pattern can be defined in the coating 3*a* in the sequent process. That is to say, the insulating base layer 3 is not formed in an unexposed-to-light portion of the coating 3*a* corresponding to the light shielding portion 17*a*; the insulating base layer 3 exposed to the supporting-board-side opening 13 (not corresponding to the reinforcing portion 16) is formed in the partly-exposed-to-light portion corresponding to the semi-transparent part 17*b*; and the reinforcing portion 16 protruding linearly from the insulating base layer 3 along the longitudinal direction to correspond to the lines of wire 4*a*, 4*b*, 4*c*, 4*d* and the insulating base layer 3 on the supporting board 2 are formed in the flying lead portion 9 in the exposed-to-light portion of the coating 3*a* corresponding to the light transmission part 17*c*.

Preferably, radiation irradiated through the photo mask 17 has an exposure wavelength of 300-450 nm, or preferably 350-420 nm. An integrated quantity of exposure light is preferably in the range of 100-1,000 mJ/cm$^2$, or preferably in the range of 200-750 mJ/cm$^2$.

When the partly-exposed-to light portion and the exposed-to-light portion of the coating 3*a* irradiated is heated at e.g. 130° C. or more to less than 150° C., it is solubilized (positive type) in the next developing process. On the other hand, when heated at e.g. 150° C. or more to 180° C. or less, it is insolubilized (negative type) in the next developing process. The development can be performed by any known method, such as a dipping process and a spraying process, using a known developing solution such as alkaline developer. In this method, it is preferable that the negative type pattern is defined in the coating 3*a*. Illustrated in FIG. 4 is an embodiment using the process steps for defining the negative type pattern.

Then, the coating 3*a* of the precursor of the polyimide resin thus patterned is finally heated to e.g. 250° C. or more to be cured (imidized), whereby the insulating base layer 3 of polyimide resin is formed with the predetermined pattern defining a plurality of protruding reinforcing portions 16 in a portion of the insulating base layer 3 of polyimide resin where the external connection terminal 7 is formed, as shown in FIG. 4(*d*).

In the case where the photosensitive synthetic resin is not used, for example, synthetic resin is prepared in the form of a dry film photoresist having the predetermined pattern and is adhesively bonded to the supporting board 2.

Preferably, the insulating base layer 3 thus formed has thickness of e.g. 3-15 μm, and the reinforcing portion 16 has thickness of e.g. 5-30 μm including thickness of the insulating base layer 3. The thickness of the same remaining as the reinforcing portion 16, not including the thickness of the insulating base layer 3, is in the range of e.g. 2-10 μm, or preferably 4-8 μm.

Then, the conductor layer 4 is formed with the wiring circuit pattern on the insulating conductor layer 3. The conductor layer 4 in the form of the wiring circuit pattern is formed of conductive material. The conductive materials that may be used include, for example, copper, nickel, gold, solder, or alloys thereof. Copper is preferably used. The conductor layer 4 in the form of the predetermined wiring circuit pattern can be provided by forming the conductor layer 4 with the predetermined wiring circuit pattern on the insulating base layer 3 by a known patterning process, such as a subtractive process and an additive process.

In the subtractive process, the conductor layer 4 is laminated on the entire surface of the insulating base layer 3 using, if necessary, an adhesive layer, first. Then, an etching resist having the same pattern as the wiring circuit pattern is formed on the conductor layer 4, and the conductor layer 4 is etched using the etching resist as a resist. Thereafter, the etching resist is removed.

In the additive process, a seed film of a thin film of conductive material is formed on the insulating base layer 3, first. Then, after a plating resist having a reverse pattern to the wiring circuit pattern is formed on the seed film, the conductor layer 4 is patterned in the form of the wiring circuit pattern by plating on a surface of the seed film on which the plating resist is not formed. Thereafter, the plating resist and the part of the seed film on which the plating resist was laminated are removed.

Of these patterning processes, the additive process is preferably used to form a fine wiring circuit pattern, as shown in FIG. 4(e) to FIG. 5(i). Specifically, in the additive process, the seed film 18 of a thin film of conductive material is formed on the entire surface of the supporting board 2 and insulating base layer 3 (including the reinforcing portion 16), first, as shown in FIG. 4(e). The seed film 18 is formed using a vacuum deposition process, or preferably using a sputtering deposition process. Chromium and copper are preferably used as the conductive material used for forming the seed film 18. To be more specific, for example a thin chrome film and a thin copper film are preferably formed in sequence on the entire surface of the supporting board 2 and insulating base layer 3 by the sputtering deposition process. Preferably, the thin chrome film has thickness of 100-600 Å and the thin copper film has thickness of 500-2,000 Å.

Sequentially, a plating resist 19 having a reverse pattern to the wiring circuit pattern is formed on the seed film 18, as shown in FIG. 5(f). The plating resist 19 may be formed in the form of the resist pattern by a known process using a dry film photoresist, for example. Then, the conductor layer 4 of the wiring circuit pattern is formed by plating on an area of the insulating base layer 3 where the plating resist 19 is not formed, as shown in FIG. 5(g). Either of the electrolysis plating and the electroless plating may be used to form the conductor layer 4. Preferably, the electrolysis plating, particularly the electrolytic copper plating, is used. This wiring circuit pattern is, for example, in the form of a pattern shown in FIG. 1 defined by a plurality of lines of wire 4a, 4b, 4c, and 4d spaced apart in parallel with each other with a given interval.

The conductor layer 4 has thickness of e.g. 2-25 μm or preferably 5-20 μm, and the lines of wire 4a, 4b, 4c, and 4d have each width of e.g. 10-500 μm or preferably 30-300 μm. The interval between the adjacent lines of wire 4a, 4b, 4c, and 4d is for example in the range of 10-1,0000 μm, or preferably 10-500 μm.

Then, the plating resist 19 is removed by a known etching process, such as a chemical etching (wet etching), or by stripping, as shown in FIG. 5(h). Then, the seed film 18 on which the plating resist 19 was formed is removed by a known etching process, such as the chemical etching (wet etching), as shown in FIG. 5(i). After the processes mentioned above, the conductor layer 4 in the form of the wiring circuit pattern is formed on the insulating base layer 3.

In the part of the supporting board 2 where the external connection terminal 7 is formed, the conductor layer 4 covers both lateral sides of and a top side of each reinforcing portion 16.

Then, a metal coating 20 is formed on a surface of the conductor layer 4, as shown in FIG. 5(j). Preferably, the metal coating 20 is formed by electroless nickel plating in the form of a hard, thin nickel film. It is enough that the metal coating 20 has thickness enough to prevent the surface of the conductor layer 4 from being exposed. For example, the thickness of the metal coating 20 is in order of 0.05-0.1 μm. The metal coating 20 is formed on a surface of the supporting board 2 as well.

Sequentially, an insulating cover layer 5 for covering the conductor layer 4 is formed in a predetermined pattern in which a cover-layer-side opening 15 is to be formed, as shown in FIG. 6(k) to FIG. 6(m). The same insulating material as that for the insulating base layer 3 is used for forming the insulating cover layer 5. Preferably, photosensitive polyimide resin is used.

When the insulating cover layer 5 is formed using e.g. the photosensitive polyimide resin, a solution of precursor of the photosensitive polyimide resin (polyamic acid resin) is coated over the entire surface of the insulating base layer 3 and the metal coating 20, as shown in FIG. 6(k), and then is heated at e.g. 60-150° C., or preferably at 80-120° C., to form a coating 5a of the precursor of the photosensitive polyimide resin. Then, the coating 5a is exposed to light through the photo mask 21 (a common photo mask having a light shielding part and a light transmission part), as shown in FIG. 6(l). If required, the exposed part is heated to a certain temperature. Thereafter, the coating 5a is developed and thereby is patterned so that the conductor layer 4 can be covered with the coating 5a. When the coating 5a is patterned, the coating 5a is opened in its area where the external connection terminal 7 is to be formed, to form the cover-layer-side opening 15 from which the conductor layer 4 is exposed.

The coating 5a can be exposed to light and developed under the same condition as the condition for exposing and developing the insulating base layer 3. The patterning of the coating 5a is preferably produced with the negative image. Shown in FIG. 6 is an embodied form in which the coating 5a is patterned with the negative image.

Then, as shown in FIG. 6(m), the coating 5a of the precursor of the photosensitive polyimide resin thus patterned is finally heated, for example, to 250° C. or more to be cured (imidized), whereby the insulating cover layer 5 of polyimide resin is formed on the conductor layer 4. The insulating cover layer 5 has thickness of e.g. 1-30 μm, or preferably 2-20 μm.

Then, the supporting board 2 is cut out into a predetermined shape like a gimbal 8 by a known process such as the chemical etching, as shown in FIG. 6(n). It is also cut out at its portion where the external connection terminal 7 is formed to form a supporting-board-side opening 13. The supporting-board-side opening 13 is formed in a generally rectangular shape to include the lines of wire 4a, 4b, 4c, 4d, when viewed from the top.

Then, as shown in FIG. 7(o), the insulating base layer 3 exposed from the supporting-board-side opening 13 is removed so that the reinforcing portion 16 can be left (with its thickness of 2-10 μm or preferably 4-8 μm left), by the known etching process, such as the chemical etching (wet etching) and the dry etching using plasma, to form a base-layer-side opening 14. Thereafter, as shown in FIG. 7(p), the metal coating 20 exposed from the base-layer-side opening 14 and the cover-layer-side opening 15 is removed by the known etching process such as the chemical etching (wet etching). In this process, the metal coating 20 formed on the surface of the supporting board 2 is also removed.

Then, as shown in FIG. 7(q), the seed film 18 exposed from the bottoms of the lines of wire 4a, 4b, 4c, 4d in the conductor layer 4 exposed from the base-layer-side opening 14 and the cover-layer-side opening 15 is removed by the known etching process such as the chemical etching (wet etching), to form the flying lead portion 9 in which the conductor layer 4 is exposed at both of front and back sides thereof.

Thereafter, as shown in FIG. 7(r), a nickel plating layer 10 having a thickness of 1-5 μm and a gold plating layer 11 having a thickness of 1-5 μm are formed on the conductor layer 4 exposed in the flying lead portion 9 sequentially by the electrolysis nickel plating and the electrolysis gold plating, or only the gold plating layer 11 having a thickness of 2-10 μm is formed thereon by the electrolysis gold plating (not shown), to form a pad portion 12, so as to form the external connection terminal 7. The suspension board with circuit 1 is produced by the method described above.

This suspension board with circuit 1 includes the insulating base layer 3 as the reinforcing portion 16 for reinforcing the conductor layer 4. This can provide the result that even when the pad portion 12 of the flying lead portion 9 is physically damaged directly when the conductor layer 4 is formed into the fine wiring circuit pattern via various production processes of the additive process, fatal damage or breaking of the pad portion 12 can be prevented by the reinforcement provided by the reinforcing portion 16. This can produce the suspension board with circuit 1 wherein while the conductor layer 4 is formed in the form of a fine wiring circuit pattern, the fatal damage or breaking of the pad portion 12 in the flying lead portion 9 can be effectively prevented, thus providing improvement in reliability of the suspension board with circuit 1 for use.

Although the embodiment wherein the reinforcing portion 16 is formed continuously from the insulating base layer 3 in the flying lead portion 9 has been described above, the reinforcing portion 16 may be formed continuously from the insulating cover layer 5. FIG. 8 is a sectional view of an external connection terminal of such an embodiment of the suspension board with circuit taken along a longitudinal direction of the suspension board with circuit. FIG. 9 is a sectional view of the external connection terminal of the suspension board with circuit shown in FIG. 8 taken along a direction orthogonal to the longitudinal direction of the suspension board with circuit. In FIGS. 8 and 9 and FIGS. 10 to 17 illustrated later, the same parts and members as those of the suspension board with circuit shown in FIGS. 1-7 are designated by the same reference numerals and characters, and the description on those parts and members is omitted.

In the suspension board with circuit 1 shown in FIGS. 8 and 9 as well, the external connection terminal 7 includes a flying lead portion 9 which is formed in such a manner that the supporting board 2 and the insulating base layer 3 are opened at the back side of the conductor layer 4 and also the insulating cover layer 5 is opened at the front side of the conductor layer 4, whereby both of the front side and the back side of the conductor layer 4 are exposed. These openings correspond in position to each other. Also, a pad portion 12 is arranged at both of the front and back sides of the conductor layer 4.

In the flying lead portion 9, the insulating cover layer 5 is included as a reinforcing portion 16 for reinforcing the conductor layer 4. The reinforcing portion 16 is arranged along a longitudinal direction of the conductor layer 4 exposed in the flying lead portion 9 in the state of being laminated on a top surface of each line of wire 4a, 4b, 4c, 4d. Also, it is formed to be continuous from the insulating cover layer 5 at both lengthwise ends of the flying lead portion 9 so that it passes through the flying lead portion 9 with respect to the longitudinal direction.

Next, the method of producing this suspension board with circuit 1 will be described with reference to FIGS. 10-13. It should be noted that in FIGS. 10-13, part of the suspension board with circuit 1, including the area where the external connection terminal 7 is formed, is shown in section taken along a longitudinal direction of the suspension board with circuit 1 and is shown at the top of each process, and part of the suspension board with circuit 1, including the area where the external connection terminal 7 is formed, is shown in section taken along a direction orthogonal to the longitudinal direction of the suspension board with circuit 1 (or along a widthwise direction (hereinafter this definition is used) and is shown at the bottom of each process.

In this method, as shown in FIG. 10(a), the supporting board 2 is prepared, first. The same metal foil or thin metal sheet as the one described above is used as the supporting board 2.

Then, the insulating base layer 3 is formed with a predetermined pattern, as shown in FIG. 10(b) to FIG. 10(d). The insulating base layer 3 is formed in the same manner using the same material as the one mentioned above. For example, when photosensitive polyimide resin is used to form the insulating base layer 3 in the form of a predetermined pattern on the supporting board 2, a solution of precursor (polyamic acid resin) of the photosensitive polyimide resin is coated over the entire surface of the supporting board 2, as shown in FIG. 10(b). Thereafter, a coating 3a of the precursor of the photosensitive polyimide resin is formed in the same manner as in the embodiment mentioned above. Then, the coating 3a is exposed to light through a photo mask 22 in the same manner as in the embodiment mentioned above, as shown in FIG. 10(c), and, if required, it is heated to a certain temperature. Thereafter, the coating 3a is developed to form the coating 3a into a predetermined pattern. In this embodiment, it is not necessary to form the protruding reinforcing portion 16 on the insulating base layer 3, as in the embodiment mentioned above. Accordingly, for example, when the coating 3a is formed with a negative type pattern, a common photo mask 22 comprising a light shielding part (whose light transmission is 0%) corresponding to a portion of the coating 3a where the insulating base layer 3 is not to be formed, and a light transmission part (whose light transmission is 100%) corresponding to a portion of the supporting board 2 where the insulating base layer 3 is to be formed, is used.

Then, as shown in FIG. 10(d), the coating 3a of the precursor of the polyimide resin thus patterned is finally heated to 250° C. or more to be cured (imidized), whereby the insulating base layer 3 of polyimide resin is formed with the predetermined pattern.

In the case where the photosensitive synthetic resin is not used, for example, synthetic resin is prepared in the form of a dry film photoresist having the predetermined pattern and is adhesively bonded to the supporting board 2.

Then, the conductor layer 4, which is formed of the same conductive material as in the embodiment mentioned above, is formed with the wiring circuit pattern on the insulating base layer 3 in the same manner. For example, in the additive process, a seed film 18 of a thin film of conductive material is formed on the entire surface of the supporting board 2 and insulating base layer 3 in the same manner as in the above, first, as shown in FIG. 11(e). Then, after a plating resist 19 having a reverse pattern to the wiring circuit pattern is formed on the seed film 18 in the same manner as in the above, as shown in FIG. 11(f), the conductor layer 4 in the form of the wiring circuit pattern is formed on a surface of the seed film 18, on which the plating resist 19 is not formed, in the same manner as in the above, as shown in FIG. 11(g).

Then, after the plating resist 19 is removed in the same manner as in the above, as shown in FIG. 11(h), the part of the seed film 18 on which the plating resist 19 was formed is also removed, as shown in FIG. 11(i). After the processes described above, the conductor layer 4 in the form of the wiring circuit pattern is formed on the insulating base layer 3.

Sequentially, a metal coating 20 is formed on a surface of the conductor layer 4 and on a surface of the supporting board 2 in the same manner as in the above, as shown in FIG. 11(j). Thereafter, an insulating cover layer 5 for covering the conductor layer 4 is formed in a predetermined pattern defining a cover-layer-side opening 15 and a reinforcing portion 23, as shown in FIG. 12(*k*) to FIG. 12(*m*). The same insulating material as that for the insulating base layer 3 is used for forming the insulating cover layer 5.

When the insulating cover layer 5 is formed using e.g. the photosensitive polyimide resin, a solution of precursor (polyamic acid resin) of the photosensitive polyimide resin is coated over the insulating base layer 3 and the metal coating 20, as shown in FIG. 12(*k*), to form a coating 5*a* of the precursor of the photosensitive polyimide resin in the same manner as in the above. Then, the coating 5*a* is exposed to light through a photo mask 24, as shown in FIG. 12(*l*). If required, the exposed part is heated to a certain temperature. Thereafter, the coating 5*a* is developed and thereby is patterned so that the conductor layer 4 can be covered with the coating 5*a*.

For example, when the coating 5*a* is formed with a negative type pattern in this patterning process, the photo mask 24 used for that patterning comprises a light shielding part 24*a* (whose light transmission is 0%) corresponding to a portion of the coating 5*a* where the insulating cover layer 5 including the cover-layer-side opening 15 is not to be formed, and a light transmission part 24*b* (whose light transmission is 100%) corresponding to a portion of the supporting board 2 where the insulating cover layer 5 including the reinforcing portion 23 is to be formed.

When this photo mask is used, a specific pattern is defined in the coating 5*a* in the sequent process. Specifically, a generally rectangular cover-layer-side opening 15 is formed in an unexposed-to-light portion of the coating 5*a* corresponding to the light shielding portion 24*a* so that the lines of wire 4*a*, 4*b*, 4*c*, 4*d* can be included in the cover-layer-side opening 15 and also a plurality of reinforcing portions 23, passing through the cover-layer-side opening 15 in the longitudinal direction, are formed in the exposed-to-light portion of the coating 5*a* corresponding to the light transmission part 24*b* so that they can be continuous from the insulating cover layer 5 in the state of being laminated on the top surfaces of the lines of wire 4*a*, 4*b*, 4*c*, 4*d*.

The coating 5*a* can be exposed to light and developed under the same condition as the condition for exposing and developing the insulating base layer 3. The patterning of the coating 5*a* is preferably produced with the negative image. Shown in FIG. 12 is an embodied form in which the coating 5*a* is patterned with the negative image.

Then, as shown in FIG. 12(*m*), the coating 5*a* of the precursor of the photosensitive polyimide resin thus patterned is cured (imidized) in the same manner as in the above, whereby the insulating cover layer 5 of polyimide resin is formed on the conductor layer 4.

Then, the supporting board 2 is cut out into a predetermined shape like a gimbal 8 in the same manner as in the above, as shown in FIG. 12(*n*). It is also cut out at its portion where the external connection terminal 7 is formed, to form the supporting-board-side opening 13 in the same manner as in the above.

Then, as shown in FIG. 13(*o*), the insulating base layer 3 exposed from the supporting-board-side opening 13 is removed by the known etching process such as the chemical etching (wet etching) to form the base-layer-side opening 14. Thereafter, as shown in FIG. 13(*p*), the metal coating 20 exposed from the base-layer-side opening 14 and the cover-layer-side opening 15 and the metal coating 20 formed on the front side of the supporting board 2 are removed in the same manner as in the above. Then, as shown in FIG. 13(*q*), the seed film 18 on the bottoms of the lines of wire 4*a*, 4*b*, 4*c*, 4*d* in the conductor layer 4 exposed from the base-layer-side opening 14 and the cover-layer-side opening 15 is removed in the same manner as in the above, to form the flying lead portion 9 in which the conductor layer 4 is exposed at both of the front and back sides thereof.

Thereafter, as shown in FIG. 13(*r*), a nickel plating layer having a thickness of 1-5 μm and a gold plating layer having a thickness of 1-5 μm are formed on the conductor layer 4 exposed in the flying lead portion 9 sequentially by the electrolysis nickel plating and the electrolysis gold plating, or only the gold plating layer 11 having a thickness of 2-10 μm is formed thereon by the electrolysis gold plating (not shown), to form a pad portion 12, so as to form the external connection terminal 7. The suspension board with circuit 1 is produced by the method described above.

This suspension board with circuit 1 includes the insulating cover layer 5 as the reinforcing portion 23 for reinforcing the conductor layer 4. This can provide the result that even when the pad portion 12 of the flying lead portion 9 is physically damaged directly when the conductor layer 4 is formed into the fine wiring circuit pattern via various production processes of the additive process, fatal damage or breaking of the pad portion 12 can be prevented by the reinforcement provided by the reinforcing portion 23. This can produce the suspension board with circuit 1 wherein while the conductor layer 4 is formed in the fine wiring circuit pattern, the fatal damage or breaking of the pad portion 12 in the flying lead portion 9 can be effectively prevented, thus providing improvement in reliability of the suspension board with circuit 1 for use.

In this method, the base-layer-side opening 14 may be previously formed in the insulating base layer 3 shown in FIG. 10(*c*) in the process of patterning the coating 3*a* for forming the insulating base layer 3 so that when the supporting board 2 is cut out in the portion thereof where the external connection terminal 7 is to be formed as shown in FIG. 12(*n*), to form the supporting-board-side opening 13, the conductor layer 4 can be exposed from the supporting-board-side opening 13 and the previously formed base-layer-side opening 14.

Also, the metal coating 20 may be formed before the removal of the seed film 18 as well as after the removal of the seed film 18. To be more specific, for example, in the case of the seed film 18 formed by laminating a thin chromium film and a thin copper film sequentially, the metal coating 20 may be formed in such a manner that the thin copper film is removed first, and, then, the metal coating 20 is formed before the thin chromium film is removed. This can eliminate the need to form the metal coating 20 on the surface of the supporting board 2, thus providing the advantage that contamination and damage of the supporting board 2 can be prevented.

In practice, the suspension board with circuit 1 described above can be produced using a production line including the roll-to-roll process. For example, a film of suspension board can be produced continuously by the roll-to-roll process until the flying lead portion 9 is formed and then is cut off for each suspension board with circuit 1. Then, the pad portion 12 is formed in the flying lead portion 9.

EXAMPLE

While in the following, the present invention will be described in further detail with reference to Examples and Comparative Example, the present invention is not limited thereto.

Example 1

The following processes were carried out using a roll-to-roll process, to obtain a suspension board with circuit.

A supporting board of a stainless foil of 300 mm wide, 20 cm thick, and 120 m long was prepared (Cf. FIG. 4(a)). Then, after a solution of polyamic acid resin was coated over the entire surface of the supporting board, the coated resin was heated at 100° C., to form a coating of the polyamic acid resin having a thickness of 25 µm (Cf. FIG. 4(b)). Then, the coating thus formed was exposed to light of 720 mJ/cm$^2$ through a gradation exposure mask comprising a light shielding part (whose light transmission is 0%), a semi-transparent part (whose light transmission is 50%), and a light transmission part (whose light transmission is 100%) and was heated at 180° C. Then, it was developed using alkaline developer (Cf. FIG. 4(c)). Thereafter, the coating was cured at a highest temperature of 420° C., whereby the insulating base layer of polyimide resin was formed with a predetermined pattern defining a plurality of protruding reinforcing portions in a portion of the insulating base layer where the external connection terminal was formed (Cf. FIG. 4(d)). The thickness of the insulating base layer thus formed was 10 µm and the thickness of each reinforcing portion (left as the reinforcing portion, not including the thickness of the insulating base layer) was 4 µm.

Sequentially, a thin chromium film having a thickness of 400 Å and a thin copper film having a thickness of 700 Å were formed in sequence on the entire surface of the supporting board and insulating base layer (including the reinforcing portion) by the sputtering deposition process, to thereby form a seed film (Cf. FIG. 4(e)). Then, after a dry film photoresist was laminated on the seed film, it was exposed to light of 235 mJ/cm$^2$ through the photo mask and then was developed to remove an unexposed-to-light portion thereof using alkaline developer. After these processes, a plating resist having a reverse pattern to the wiring circuit pattern was formed on the seed film (Cf FIG. 5(f)).

Then, the conductor layer in the form of the wiring circuit pattern was formed by electrolysis copper plating on an area of the insulating base layer where the plating resist was not formed (Cf. FIG. 5(g)). The thickness of the conductor layer thus formed was 12 µm and the width of the lines of wire was 280 µm. The interval between the adjacent lines of wire was 480 µm.

Then, after the plating resist was stripped (FIG. 5(h)), the thin copper film on which the plating resist had been formed was removed by the chemical etching (Cf. FIG. 5(i)). Then, a metal coating of a hard, thin nickel film having a thickness of 0.1 µm was formed on a surface of the conductor layer by electroless nickel plating using palladium solution and, then, the thin chromium film was removed by the chemical etching process (Cf. FIG. 5(j)).

Then, after a solution of polyamic acid resin was coated over the entire surface of the insulating base layer and metal coating, the coated resin was heated at 100° C., to form a coating of the polyamic acid resin having a thickness of 20 µm (Cf. FIG. 6(k)). Then, the coating thus formed was exposed to light of 720 mJ/cm$^2$ through a photo mask and was heated at 180° C. Then, it was developed using alkaline developer and thereby is patterned so that the conductor layer can be covered with the coating (FIG. 6(l)). When the coating was patterned, a cover-layer-side opening was formed in an area of the coating where the external connection terminal was to be formed, so that the conductor layer was exposed from the cover-layer-side opening. Thereafter, the coating was cured at a highest temperature of 420° C., whereby the insulating cover layer of polyimide resin was formed with a predetermined pattern defining the cover-layer-side opening in a portion of the insulating cover layer where the external connection terminal was formed (Cf. FIG. 6(m)). The thickness of the insulating cover layer thus formed was 5 µm.

Then, the dry film photoresist was laminated on the entire surface of the supporting board, except an area thereof where the gimbals and supporting-board-side opening were to be formed, to cover the supporting board. Thereafter, it was exposed to light of 105 mJ/Cm$^2$ and then was developed using alkaline developer, to form an etching resist. Thereafter, with the etching resist as a resist, the supporting board was etched using ferric chloride solution, to form the gimbals and the supporting-board-side opening (Cf. FIG. 6(n)).

Thereafter, the insulating base layer exposed from the supporting-board-side opening was removed by the chemical etching so that the reinforcing portion can be left (with its thickness of 4 µm left) to form a base-layer-side opening (Cf. FIG. 7(o)). Thereafter, the metal coating exposed from the base-layer-side opening and the cover-layer-side opening was removed by the chemical etching (Cf FIG. 7(p)). Further, the seed film (thin copper film and thin chromium film) exposed from the bottom of each line of wire on the conductor layer exposed from the base-layer-side opening and cover-layer-side opening was removed by the chemical etching to thereby form the flying lead portion in which the conductor layer was exposed at both of the front and back sides thereof (Cf. FIG. 7(q)).

Then, the dry film photoresist was laminated on the suspension board with circuit obtained, to cover the entire surface of the suspension board with circuit. Thereafter, it was exposed to light of 105 mJ/cm$^2$ and then was developed using alkaline developer, to form an etching resist. Thereafter, with the etching resist as a resist, the suspension board with circuit was etched using ferric chloride solution, to be cut off for each suspension board with circuit.

Then, a nickel plating layer having a thickness of 1 µm and a gold plating layer having a thickness of 1 µm were formed on the conductor layer exposed in the flying lead portion sequentially by the electrolysis nickel plating and the electrolysis gold plating, to form a pad portion, so as to form the external connection terminal (Cf FIG. 7(r)). The suspension board with circuit was produced by the method described above.

In the production of this suspension board with circuit, no failure occurred in the flying lead portion.

Example 2

The following processes were carried out using a roll-to-roll process, to obtain a suspension board with circuit.

A supporting board of a stainless foil of 300 mm wide, 20 µm thick, and 120 m long was prepared (Cf FIG. 10(a)). Then, after a solution of polyamic acid resin was coated over the entire surface of the supporting board, the coated resin was heated at 100° C., to form a coating of the polyamic acid resin having a thickness of 25 µm (Cf. FIG. 10(b)). Then, the coating thus formed was exposed to light of 720 mJ/cm$^2$ through a photo mask and was heated at 180° C. Then, it was developed using alkaline developer (Cf FIG. 10(c)). Thereafter, the coating was cured at a highest temperature of 420° C., whereby the insulating base layer of polyimide resin was formed with a predetermined pattern (Cf FIG. 10(d)). The thickness of the insulating base layer thus formed was 10 µm.

Sequentially, a thin chromium film having a thickness of 400 Å and a thin copper film having a thickness of 700 Å were formed in sequence on the entire surface of the supporting board and insulating base layer by the sputtering deposition process, to thereby form a seed film (Cf. FIG. 10(e)). Then, after a dry film photoresist was laminated on the seed film, it was exposed to light of 235 mJ/cm² through the photo mask and then was developed to remove an unexposed-to-light portion thereof using alkaline developer. After these processes, a plating resist having a reverse pattern to the wiring circuit pattern was formed on the seed film (Cf. FIG. 11(f)).

Then, the conductor layer in the form of the wiring circuit pattern was formed by electrolysis copper plating on an area of the insulating base layer where the plating resist was not formed (Cf. FIG. 11(g)). The thickness of the conductor layer thus formed was 12 µm and the width of the lines of wire was 280 µm. The interval between the adjacent lines of wire was 480 µm.

Then, after the plating resist was stripped (FIG. 11(h)), the thin copper film on which the plating resist had been formed was removed by the chemical etching (Cf. FIG. 11(i)). Then, a metal coating of a hard, thin nickel film having a thickness of 0.1 µm was formed on a surface of the conductor layer by electroless nickel plating using palladium solution and, then, the thin chromium film was removed by the chemical etching process (Cf. FIG. 11(j).

Then, after a solution of polyamic acid resin was coated over the entire surface of the insulating base layer and metal coating, the coated resin was heated at 100° C., to form a coating of the polyamic acid resin having a thickness of 20 µm (Cf. FIG. 12(k)). Then, the coating thus formed was exposed to light of 720 mJ/cm² through the photo mask and was heated at 180° C. Then, it was developed using alkaline developer and thereby is patterned so that the conductor layer can be covered with the coating (FIG. 12(l)). When the coating was patterned, a cover-layer-side opening and a plurality of reinforcing portions laminated on top surfaces of the lines of wire in the cover-layer-side opening and passing through the cover-layer-side opening in the longitudinal direction were formed in an area of the coating where the external connection terminal was to be formed. Thereafter, the coating was cured at a highest temperature of 420° C., whereby the insulating cover layer of polyimide resin was formed with a predetermined pattern (Cf FIG. 12(m)). The thickness of the insulating cover layer thus formed was 5 µm.

Then, the dry film photoresist was laminated on the entire surface of the supporting board, except an area thereof where the gimbals and supporting-board-side opening were to be formed, to cover the supporting board. Thereafter, it was exposed to light of 105 mJ/cm² and then was developed using alkaline developer, to form an etching resist. Thereafter, with the etching resist as a resist, the supporting board was etched using ferric chloride solution, to form the gimbals and the supporting-board-side opening (Cf. FIG. 12(n)).

Thereafter, the insulating base layer exposed from the supporting-board-side opening was removed by the chemical etching, to form the base-layer-side opening (Cf. FIG. 12(o)). Thereafter, the metal coating exposed from the base-layer-side opening and cover-layer-side opening was removed by the chemical etching (Cf FIG. 12(p)). Further, the seed film (thin chromium film) exposed from the bottom of each line of wire on the conductor layer exposed from the base-layer-side opening and cover-layer-side opening was removed by the chemical etching to thereby form the flying lead portion in which the conductor layer was exposed at both of the front and back sides thereof (Cf. FIG. 12(q)).

Then, the dry film photoresist was laminated on the suspension board with circuit obtained, to cover the entire surface of the suspension board with circuit. Thereafter, it was exposed to light of 105 mJ/cm² and then was developed using alkaline developer, to form an etching resist. Thereafter, with the etching resist as a resist, the suspension board with circuit was etched using ferric chloride solution, to be cut off for each suspension board with circuit.

Then, a nickel plating layer having a thickness of 1 µm and a gold plating layer having a thickness of 1 µm were formed on the conductor layer exposed in the flying lead portion sequentially by the electrolysis nickel plating and the electrolysis gold plating, to form a pad portion, so as to form the external connection terminal (Cf. FIG. 12(r)). The suspension board with circuit was produced by the method described above.

In the production of this suspension board with circuit, no failure occurred in the flying lead portion.

Comparative Example 1

Except that when the insulating cover layer was patterned, the cover-layer-side opening was formed in the insulating cover layer but the reinforcing portion was not formed on the insulating cover layer, the same operation as in Example 2 was carried out to obtain a suspension board with circuit (Cf FIG. 14).

In the production of this suspension board with circuit, failure occurred in the flying lead portion.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A suspension board with circuit comprising a metal supporting layer, an insulating base layer formed on the metal supporting layer, a conductor layer formed on the insulating base layer, an insulating cover layer formed on the conductor layer, and a connection terminal portion comprising:

a first opening formed in the metal support layer and provided on a first side of the conductor layer;

a second opening formed in the insulating base layer and provided on the first side of the conductor layer, the second opening corresponding in location to the first opening;

a third opening formed in the insulating cover layer and provided on a second side of the conductor layer, the third opening corresponding in location to the second opening;

and a flying lead portion comprising:

a conductor line that is formed from the conductor layer in an area that is exposed by the first opening, the second opening and the third opening, and a reinforcing structure that is formed from at least one of the insulating base layer and the insulating cover layer, the reinforcing structure being provided in a longitudinal direction along the conductor line and not in a lateral direction between adjacent conductor lines for reinforcing the conductor line.

2. The suspension board with circuit according to claim 1, wherein the reinforcing portion is embedded in the conductor line.

3. The suspension board with circuit according to claim 1, wherein the reinforcing portion is formed continuously from the insulating base layer in the flying lead portion.

4. The suspension board with circuit according to claim 1, wherein the reinforcing portion is formed continuously from the insulating cover layer in the flying lead portion.

* * * * *